(12) United States Patent
Hasegawa

(10) Patent No.: US 6,913,648 B2
(45) Date of Patent: Jul. 5, 2005

(54) PREPARING CRYSTALS OF RARE EARTH ELEMENT-ACTIVATED, ALKALINE EARTH METAL FLUOROHALIDE BASED STIMULABLE PHOSPHOR PRECURSOR

(75) Inventor: Kazuhiro Hasegawa, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 32 days.

(21) Appl. No.: 10/280,048

(22) Filed: Oct. 25, 2002

(65) Prior Publication Data

US 2003/0056713 A1 Mar. 27, 2003

Related U.S. Application Data

(62) Division of application No. 09/617,431, filed on Jul. 14, 2000, now abandoned.

(30) Foreign Application Priority Data

Jul. 15, 1999 (JP) ............................................. 11-201413

(51) Int. Cl.[7] .................................................. C30B 7/14
(52) U.S. Cl. ............................ 117/68; 117/69; 117/200; 117/24; 117/202; 422/245.1
(58) Field of Search .............................. 117/65, 69, 200, 117/201; 422/202, 245.1

(56) References Cited

U.S. PATENT DOCUMENTS

| | | | |
|---|---|---|---|
| 4,041,134 A | 8/1977 | Kikuchi et al. | |
| 4,154,809 A | 5/1979 | Swindells et al. | |
| 4,239,968 A | 12/1980 | Kotera et al. | |
| 5,023,803 A | 6/1991 | Loftis et al. | |
| 5,215,632 A | 6/1993 | Fritts et al. | |
| 5,702,851 A | 12/1997 | Saito et al. | |
| 5,756,306 A | 5/1998 | Yamaguchi et al. | |
| 5,952,666 A | * 9/1999 | Nakano et al. | .......... 250/484.4 |
| 6,383,412 B1 | * 5/2002 | Hasegawa | ............ 252/301.4 H |
| 6,483,122 B1 | * 11/2002 | Maezawa et al. | ........... 250/582 |
| 6,531,073 B1 | * 3/2003 | Wakamatsu et al. | . 252/301.4 H |
| 6,603,129 B2 | * 8/2003 | Kawabata et al. | ....... 250/484.4 |
| 6,638,447 B2 | * 10/2003 | Wakamatsu et al. | . 252/301.4 H |

FOREIGN PATENT DOCUMENTS

| | | |
|---|---|---|
| JP | 55-12145 A | 1/1980 |
| JP | 86086 A | 4/1987 |
| JP | 233369 A7 | 9/1995 |

OTHER PUBLICATIONS

Brian R. Pamplin, "Crystal Growth", Pergamon Press New York, 1980, pp. 538–543.

* cited by examiner

Primary Examiner—Robert Kunemund
(74) Attorney, Agent, or Firm—Birch, Stewart, Kolasch & Birch, LLP

(57) ABSTRACT

There is provided an apparatus for preparing crystals of a phosphor precursor, comprising a reactor, a stirrer, and a supply pipe for supplying, into the reactor, a solution containing at least an aqueous solution of inorganic fluoride salt, wherein an ion concentration measuring device is provided in at least one of an interior of the reactor and a liquid contacting portion which contacts the solution containing an aqueous solution of inorganic fluoride salt.

10 Claims, 3 Drawing Sheets

F I G. 1
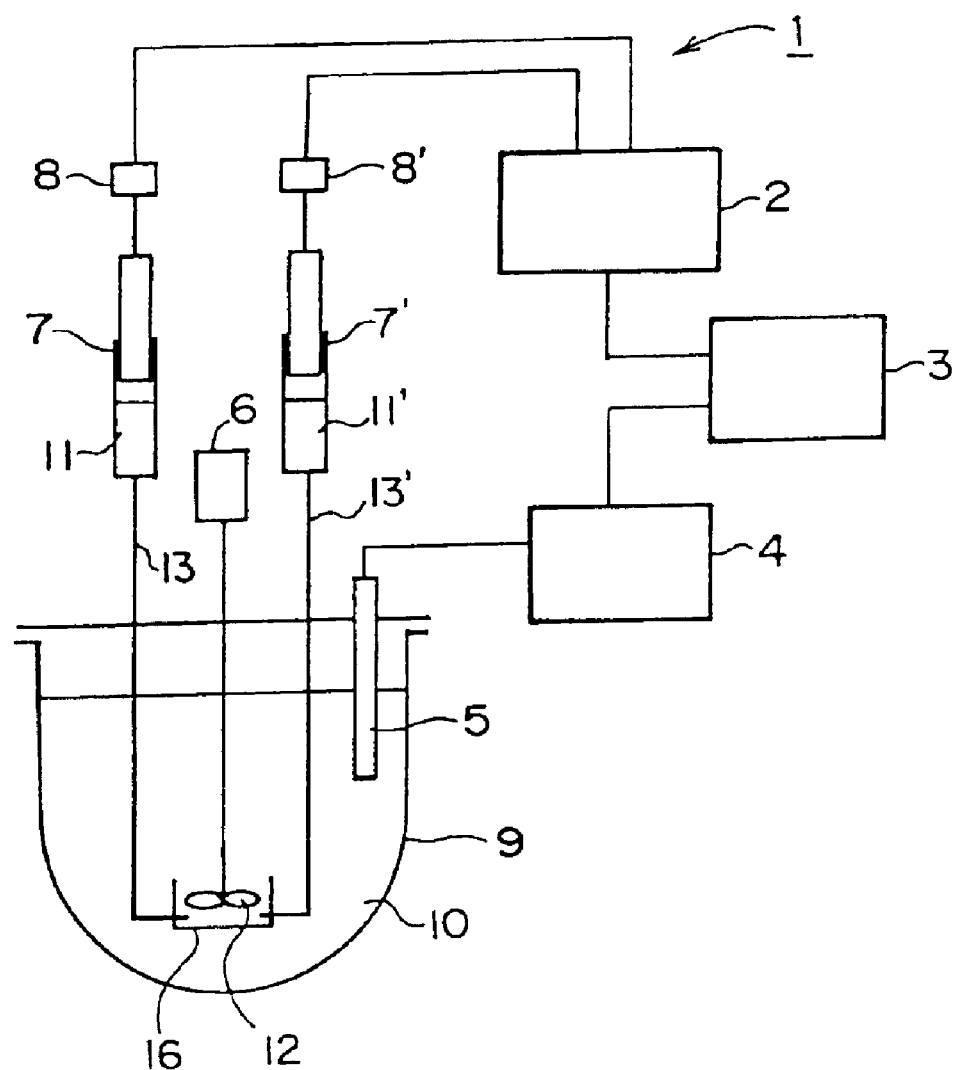

TO REACTOR

F I G. 4
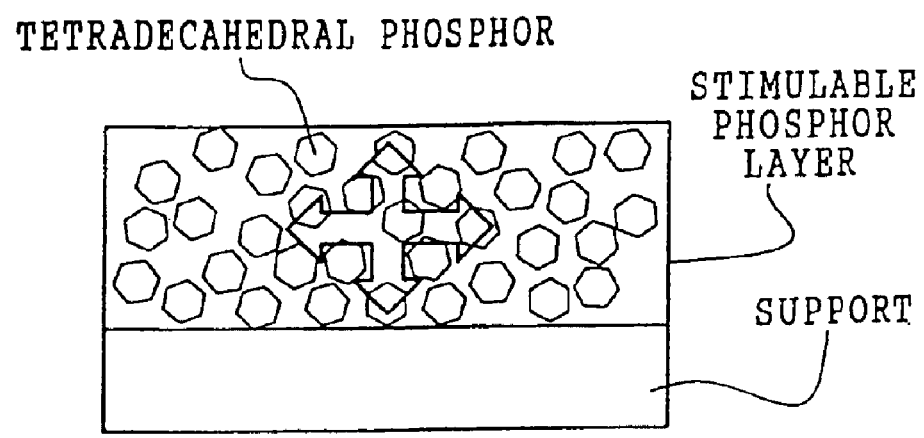

PREPARING CRYSTALS OF RARE EARTH ELEMENT-ACTIVATED, ALKALINE EARTH METAL FLUOROHALIDE BASED STIMULABLE PHOSPHOR PRECURSOR

This application is a divisional of application Ser. No. 09/617,431, filed on Jul. 14, 2000, now abandoned the entire contents of which are hereby incorporated by reference and for which priority is claimed under 35 U.S.C. § 120; and this application claims priority of application Ser. No. 11-201413 filed in Japan on Jul. 15, 1999 under 35 U.S.C. § 119.

BACKGROUND OF THE INVENTION

1. Field of the Invention

The present invention relates to an apparatus for preparing crystals of a rare earth element-activated, alkaline earth metal fluorohalide based stimulable phosphor precursor.

2. Description of the Related Art

A radiation image recording and reproducing method using a stimulable phosphor, which can replace conventional radiography, is known and described, for example, in Japanese Patent Application Laid-Open (JP-A) No. 55-12145. This method utilizes a radiation image conversion panel containing a stimulable phosphor (that is, an accumulative phosphor sheet). In this method, radiation transmitted through a subject or emitted from an object to be examined is absorbed into the stimulable phosphor of the panel, and the stimulable phosphor is excited by an electromagnetic wave (excitation light) such as visible light or infrared light in a time sequential manner so as to allow radiation energy accumulated in the stimulable phosphor to emit as fluorescent emission (stimulable emission). Subsequently, an electric signal is obtained by photoelectrically reading the fluorescence, and based on the obtained electric signal, a radiation image of the subject or object to be examined is reproduced as a visible image. The panel for which the reading has been completed is made ready for subsequent photographing after remaining images have been deleted therefrom. That is, the radiation image conversion panel can be used repeatedly.

The above-described radiation image recording and reproducing method has an advantage in that a radiation image having much information can be obtained using a radiation dosage much smaller than in conventional radiography using a combination of a radiographic film and an intensifying screen. Further, a radiographic film is consumed each time an image is produced in conventional radiography. In contrast, a radiation image conversion panel in the radiation image recording and reproducing method is advantageous in terms of the aspects of resource protection and economic efficiency due to reusability.

The stimulable phosphor is a phosphor which exhibits stimulable emission when excitation light is irradiated thereon after irradiation with radiation. For practical use, a phosphor which emits stimulable emission in a wavelength range from 300 to 500 nm by excitation light in a wavelength range from 400 to 900 nm is generally employed. An example of the stimulable phosphor conventionally used in radiation image conversion panels is a rare earth element-activated, alkaline earth metal fluorohalide based phosphor. The radiation image conversion panel used in the radiation image recording and reproducing method has a basic structure comprised of a support and a stimulable phosphor layer provided on the support surface. However, a support is not necessarily needed if the stimulable phosphor layer is self-supporting. The stimulable phosphor layer is usually comprised of a stimulable phosphor and a binder which contains and supports the phosphor in a state of dispersion. Further, there has been known stimulable phosphor layers which do not contain a binder and are comprised solely of a stimulable phosphor in a state of aggregates formed by vapor deposition or sintering. Furthermore, there has also been known radiation image conversion panels each having a stimulable phosphor layer in which a high polymer material is impregnated into gaps in the aggregates of stimulable phosphors. Any of the above-described stimulable phosphor layers exhibits the property of stimulable emission when irradiated with excitation light after having absorbed radiation such as X-rays. Accordingly, the energy in an amount proportionate to the amount of the radiation transmitted through a subject or emitted from an object to be examined is absorbed in the stimulable phosphor layer of the radiation image conversion panel, and a radiation image of the subject or the object to be examined is formed as an image of accumulated radiation energy in the radiation image conversion panel. The accumulation image can be released as stimulable emission by irradiation with excitation light, and the photoelectric reading of the stimulable emission and the conversion thereof into an electric signal make it possible to make the radiation energy accumulation image into a visible image.

The surface of the stimulable phosphor layer (which surface does not face the support) has generally a protective film comprised of a polymer film or a vapor-deposited film of an inorganic substance to thereby protect the stimulable phosphor layer from chemical deterioration or physical impact.

The above-described rare earth element-activated, alkaline earth metal fluorohalide based stimulable phosphor can be a stimulable phosphor excellent in practical terms for the reason that it has an excellent sensitivity and provides a radiation reproduction image having a high level of sharpness when it is used for a radiation image conversion panel. However, with the advance of practicability of a radiation image recording and reproducing method, there has increased a demand for further enhancement of the stimulable phosphor. Here, as a result of examination of the grain shape of rare earth element-activated, alkaline earth metal fluorohalide based stimulable phohsphors having been utilized, the present inventors have found that these phosphors are tabular. A conventionally known process for preparing a rare earth element-activated, alkaline earth metal fluorohalide based stimulable phosphor comprises the steps of dry-blending or blending by suspending in a water based medium, material compounds, which are an alkaline earth metal fluoride, an alkaline earth metal halide other than fluoride, a halide of a rare earth element, ammonium fluoride, and the like, firing these compounds after the addition of a sintering preventing agent if necessary, and pulverizing the fired product. Accordingly, in this conventional process, the pulverizing step after the firing step is substantially essential, and most of grains of the rare earth element-activated, alkaline earth metal fluorohalide based stimulable phosphor thus produced were tabular (hereinafter referred to merely as "tabular phosphor" on occasion).

However, in a stimulable phosphor layer obtained by applying a mixture of the above-described tabular-grained phosphor and a binder resin solution on a support and drying the coating, the tabular-grained phosphors tend to be arranged in such a manner that surfaces thereof are made parallel to the surface of the support, as illustrated in FIG. 3. When a radiation image is stored in a radiation image conversion panel having a stimulable phosphor layer in which the tabular-grained phosphors are arranged in the above-described manner and the panel is irradiated with excitation light, the excitation light and stimulable emission generated are apt to extend in a transverse direction (that is, a direction parallel to the surface of the support as shown in the horizontal arrow shown in FIG. 3). As a result, there arises a problem that the sharpness of a radiation reproduction image to be obtained is apt to deteriorate.

In order to prevent deterioration in the sharpness of a radiation reproduction image in the radiation image recording and reproducing method as described above, there is proposed a process in which a stimulable phosphor comprised of approximately cubic grains is used, as disclosed in JP-A No. 62-86086. However, the process for preparing a stimulable phosphor comprised of approximately cubic grains disclosed above cannot provide sufficient reproducibility of grain shape, grain size, and grain size distribution for industrial utilization.

Further, JP-A No. 7-233369 discloses a process for preparing a rare earth element-activated, alkaline earth metal fluorohalide based stimulable phosphor (hereinafter referred to simply as "phosphor" on occasion) having a tetradecahedral grain structure in which grain shape and grain aspect ratio are controlled. In a radiation image conversion panel having a stimulable phosphor layer in which a rare earth element-activated, alkaline earth metal fluorohalide based stimulable phosphor having a tetradecahedral grain structure (hereinafter referred to simply as "tetradecahedron-structured phosphor" on occasion) is provided, as illustrated in FIG. 4, the directionality of the tetradecahedron-structured phosphor is reduced. Accordingly, the undesirable transverse extension of the excitation light and the stimulable emission is lessened and the sharpness of a resultant radiographic reproduction image improves.

In the process for preparing the phosphor disclosed in JP-A No. 7-233369, ammonium halide is used as reactant mother liquor and an aqueous solution of barium halide and an aqueous solution of an inorganic fluoride salt are simultaneously added to the mother liquor so as to allow the reaction to proceed, thereby synthesizing a stimulable phosphor. However, the grains thus produced tend to have a high grain aspect ratio. On the other hand, although the aspect ratio can be made closer to 1 to a certain extent by adding barium halide to the reactant mother liquor in advance, this process is not satisfactory from the standpoint of controllability of grain shape, grain size, and grain size distribution.

SUMMARY OF THE INVENTION

The present invention has been devised in order to solve various problems in the above-described conventional processes and achieve the following objects. Namely, an object of the present invention is to provide an apparatus for preparing crystals of a rare earth element-activated, alkaline earth metal fluorohalide based stimulable phosphor precursor, in which controllability of grain shape, grain size, and grain size distribution of grains of crystals of a stimulable phosphor precursor to be obtained is high and the crystals can be obtained at a high yield.

Particularly, the object of the present invention is to provide an apparatus for preparing crystals of a rare earth element-activated, alkaline earth metal fluorohalide based stimulable phosphor precursor, in which when the crystals are used in a radiation image conversion panel, images of high quality can be obtained and a stimulable phosphor having good sensitivity and graininess can be obtained.

In order to solve the above-described problems, there is provided, according to a first aspect of the present invention, an apparatus for preparing crystals of a rare earth element-activated, alkaline earth metal fluorohalide based stimulable phosphor precursor from an aqueous solution of inorganic fluoride salt, the apparatus comprising: (a) a reactor having an interior; (b) a stirrer; (c) at least one supply pipe connected to the reactor for supplying the aqueous solution of inorganic fluoride salt into the reactor; and (d) at least one ion concentration measuring device provided in at least one of the interior of the reactor and a portion which contacts the aqueous solution of inorganic fluoride salts.

In accordance with a second aspect of the present invention, there is provided a process for preparing crystals of a rare earth element-activated, alkaline earth metal fluorohalide based stimulable phosphor precursor having a basic constitutional formula (1) as follows:

$$Ba_{1-x}M^{II}FX:yM^{I}, zLn \qquad (1)$$

wherein, $M^{II}$ represents at least one alkaline earth metal selected from the group consisting of Sr and Ca; $M^{I}$ represents at least one alkaline metal selected from the group consisting of Li, Na, K, Rb, and Cs; X represents at least one halogen selected from the group consisting of Cl, Br, and I; Ln represents at least one rare earth element selected from the group consisting of Ce, Pr, Sm, Eu, Gd, Tb, Tm, and Yb; and x, y, and z are respectively within ranges of $0 \leq x \leq 0.5$, $0 \leq y \leq 0.05$, and $0 < z \leq 0.2$, the process comprising the steps of: (a) preparing a reactant mother liquor of an aqueous solution containing $BaX_2$, a water soluble compound of Ln, a halide, a nitrate, nitrite, an acetate of $M^{II}$ if x in the basic constitutional formula (1) is not 0, and a halide, nitrate, nitrite, or acetate of $M^{I}$ if y in the basic constitutional formula (1) is not 0, wherein the solution has a $BaX_2$ concentration of no more than 2.5 mol/L if X is Cl or Br, and $BaX_2$ concentration of up to 5.0 mol/L if X is I after all substances have been substantially dissolved in said aqueous solution; (b) maintaining the reactant mother liquor at 20 to 100° C. while stirring; (c) preparing a precipitate of crystals of the phosphor precursor by simultaneously adding an aqueous solution of an inorganic fluoride salt and an aqueous solution of $BaX_2$ to the reactant mother liquor, while maintaining the reactant mother liquor at 20 to 100° C., and measuring an ion concentration in the reactant mother liquor using an ion concentration measuring device; and (d) separating the precipitate of crystals of the phosphor precursor.

In accordance with a third aspect of the present invention, there is provided a process for preparing crystals of a rare earth element-activated, alkaline earth metal fluorohalide based stimulable phosphor precursor having a basic constitutional formula (1) as follows:

$$Ba_{1-x}M^{II}FX:yM^{I}, zLn \qquad (1)$$

wherein, $M^{II}$ represents at least one alkaline earth metal selected from the group consisting of Sr and Ca; $M^{I}$ represents at least one alkaline metal selected from the group consisting of Li, Na, K, Rb, and Cs; X represents at least one halogen selected from the group consisting of Cl, Br, and I; Ln represents at least one rare earth element selected from the group consisting of Ce, Pr, Sm, Eu, Gd, Tb, Tm, and Yb; and x, y, and z are respectively within ranges of $0 \leq x \leq 0.5$, $0 \leq y \leq 0.05$, and $0 < z \leq 0.2$, the process comprising the steps of: (a) preparing a reactant mother liquor of an aqueous solution containing $NH_4X$, a water soluble compound of Ln, a halide, a nitrate, nitrite, an acetate of $M^{II}$ if x in the basic constitutional formula (1) is not 0, and a halide, nitrate, nitrite, or acetate of $M^{I}$ if y in the basic constitutional formula (1) is not 0, wherein the solution has a $NH_4X$ concentration from 2.0 to 4.5 mol/L after all substances have been substantially dissolved in said aqueous solution; (b) maintaining the reactant mother liquor at 20 to 100° C. while stirring; (c) preparing a precipitate of crystals of the phosphor precursor by adding a reactant liquid to the reactant mother liquor, while maintaining the reactant mother liquor at 20 to 100° C. measuring an ion concentration in the reactant mother liquor by using an ion concentration measuring device; and (d) separating the precipitate of crystals of the phosphor precursor.

BRIEF DESCRIPTION OF THE DRAWINGS

FIG. 1 is a schematic structural diagram of an apparatus for preparing crystals of a phosphor precursor according to the present invention (in a case in which an ion concentration measuring device is provided within a reactor).

FIG. 4 is a schematic diagram which illustrates an arrangement of tetradecahedron-structured rare earth element-activated, alkaline earth metal fluorohalide based stimulable phosphors in a phosphor layer of a radiation image conversion panel, and directions of photoconduction in the phosphor layer.

DESCRIPTION OF THE PREFERRED EMBODIMENTS

Figure 2:
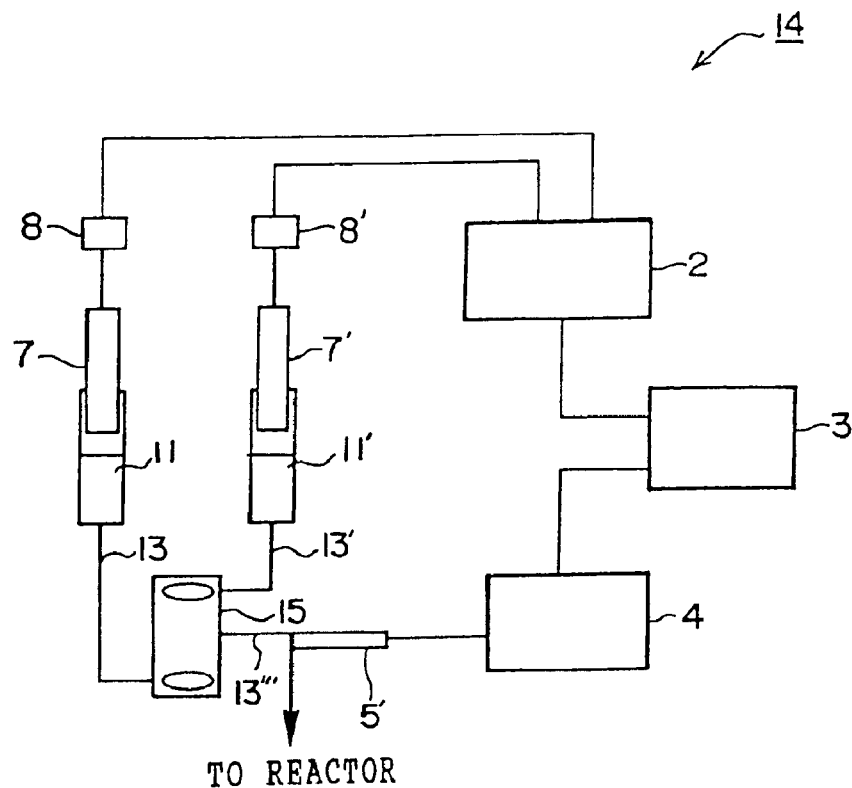
FIG. 2 is a schematic structural diagram of an apparatus for preparing crystals of a phosphor precursor according to the present invention (in a case in which an instant reactor is built in the apparatus and an ion concentration measuring device is provided in a middle position of a supply pipe).
Figure 3:
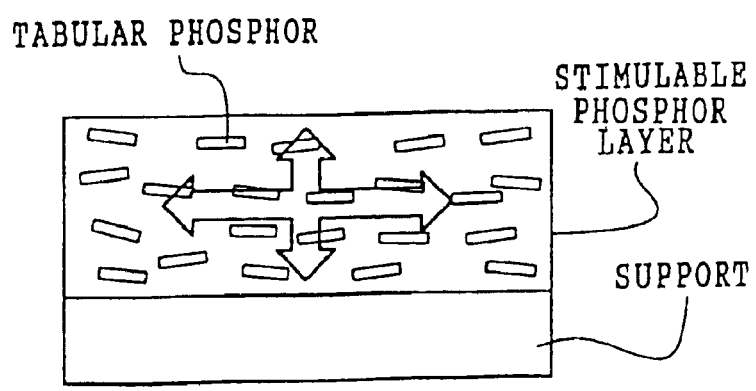
FIG. 3 is a schematic diagram which illustrates an arrangement of conventional tabular rare earth element-activated, alkaline earth metal fluorohalide based stimulable phosphors in a stimulable phosphor layer of a radiation image conversion panel, and directions of photoconduction in the stimulable phosphor layer.

An apparatus for preparing crystals of a rare earth element-activated, alkaline earth metal fluorohalide based stimulable phosphor precursor (hereinafter referred to simply as "crystals of a phosphor precursor" on occasion) according to the present invention comprises a reactor, a stirrer, and a supply pipe, and further comprises an ion concentration measuring device. If necessary, other members are also provided. The present invention will hereinafter be explained in detail.

[Crystals of Phosphor Precursor]

The crystals of a phosphor precursor obtained by the apparatus for preparing crystals of a phosphor precursor according to the present invention are not particularly limited. However, in order that images of high quality be obtained when the crystals of a phosphor precursor are used in a radiation image conversion panel, and a stimulable phosphor having good sensitivity and graininess can be obtained, a crystal having a composition represented by the following basic constitutional formula (1) is preferably used.

$$Ba_{1-x}M^{II}FX:yM^{I}, zLn \qquad (1)$$

In the basic constitutional formula (1), $M^{II}$ represents at least one alkaline earth metal selected from the group consisting of Sr and Ca. $M^{I}$ represents at least one alkaline metal selected from the group consisting of Li, Na, K, Rb, and Cs. X represents at least one halogen selected from the group consisting of Cl, Br, and I. Ln represents at least one rare earth element selected from the group consisting of Ce, Pr, Sm, Eu, Gd, Tb, Tm, and Yb, and x, y, and z are respectively set so as to be within the ranges of $0 \leq x \leq 0.5$, $0 \leq y \leq 0.05$, $0 < z \leq 0.2$.

The grain shape of the crystals of a phosphor precursor having the composition represented by the above-described basic constitutional formula (1) is not particularly limited, and examples of the grain shape may include a rectangular parallelopipedon, a columnar structure, a regular hexahedron, a regular octahedron, a polyhedron in the center of these shapes, a tetradecahedron, and so on. Among these shapes, a columnar structure and a tetradecahedron are particularly preferable, and the tetradecahedron is most preferable.

The crystals of a phosphor precursor whose grain shape is a tetradecahedron have a grain aspect ratio preferably in the range from 1.0 to 2.0. A grain size median diameter (Dm) is preferably set in the range from 1 to 10 μm. A standard deviation (σ) of grain size distribution of the above-described grains is preferably set such that σ/Dm is 50% or less.

The crystals of a phosphor precursor whose grain shape is columnar have a grain aspect ratio preferably in the range from 2.0 to 5.0. A grain size median diameter (Dm) is preferably set in the range from 1 to 20 μm. A standard deviation (σ) of grain size distribution of the grains is preferably set such that σ/Dm is 50% or less.

If the above-described grain aspect ratio, grain size median diameter (Dm), and standard deviation (σ) of grain size distribution are respectively set at values outside the above-described ranges, an image of high quality may not be obtained when the crystals of a phosphor precursor are used in the radiation image conversion panel.

The crystal of a phosphor precursor represented by the above-described basic constitutional formula (1) can be advantageously used as a stimulable phosphor material for forming a phosphor layer of a radiation image conversion panel, which can provide an image of high quality.

[Reactor]

The reactor accommodates in advance a solution containing reactant mother liquor. The solution containing reactant mother liquor is not particularly limited. However, in order to obtain the crystal of a phosphor precursor represented by the basic constitutional formula (1), the solution is prepared preferably by a mother liquor preparing step in one of phosphor preparing processes (A) and (B), which will be described later.

A material of the reactor is not particularly limited, but preferable examples of the material include copper, aluminum, stainless steel, and the like in terms of the aspects of thermal conductivity, chemical resistance, and contamination control. Particularly, it is preferable that a solution-contacting portion of the reactor be subjected to Teflon processing or enameled.

The capacity of the reactor is preferably in a range from 0.01N to 100N (liter), more preferably in a range from 0.1N to 10N (liter), given that N is the total amount (mol) of a reaction product to be obtained by the reaction.

The shape of the reactor is not particularly limited unless the effects of the present invention are impaired.

[Stirrer]

The stirrer is provided to stir the solution in the above-described reactor. Accordingly, the stirrer is not particularly limited so long as the solution in the reactor can be stirred, for example, at a desired revolving speed. Generally known stirrers can suitably be used. For example, a stirring blade for a low viscous solution, described in the Handbook of Chemical Industry (issued by Maruzen, 5th revised edition, 1988 (p887 to 920)) is suitably used.

In the stirrer in which the solution in the reactor is stirred by the rotation of a stirring blade, the revolving speed is preferably in a range from 100 to 10000 rpm, more preferably in a range from 500 to 5000 rpm.

[Supply Pipe]

The supply pipe is provided to supply the solution containing an aqueous solution of inorganic fluoride salt into the above-described reactor. A material of the supply pipe is not particularly limited and materials generally known as a supply pipe can suitably be used.

In the supplying operation, the solution containing an aqueous solution of inorganic fluoride salt accommodated, via the above-described supply pipe, in a generally known accommodating tank or an adding device, to which the supply pipe is connected, is supplied into the solution containing reactant mother liquor.

In the present invention, an "aqueous solution" means a solution prepared by dissolving a "solute" in a "water based medium". Further, the term "water based medium" has a conception which includes, needless to say, water, a liquid substance (such as alcohol) having a high affinity for water by itself or a mixture of a plurality of such substances, and a mixture of water therewith. Among these substances, water is most preferable. Accordingly, the term "aqueous solution" is used herein to mean all solutions prepared by using the "water based medium" as defined herein. Among these aqueous solutions, the most preferred is a solution prepared by using water as the "water based medium". On the other hand, the "solute" is appropriately selected depending on the type of the aqueous solutions (that is, raw material solution, reactant mother liquor, aqueous solution to be added, and the like).

[Ion Concentration Measuring Device]

The ion concentration measuring device is provided in at least one of an interior of the above-described reactor and a solution-contacting portion, which contacts a solution containing the aqueous solution of inorganic fluoride salt. Preferably, the solution-contacting portion is provided in the supply pipe.

The ion concentration measuring device is comprised of at least an ion concentration detector for detecting ion concentration, and an ion concentration meter. Accordingly, the description "the ion concentration measuring device is provided in at least one of an interior of the reactor and a solution-contacting portion of the reactor, which contacts a solution containing the aqueous solution of inorganic fluoride salt" given in the present invention means that "the ion concentration detector provided in the ion concentration measuring device is provided in at least one of an interior of the reactor and a solution-contacting portion of the reactor, which contacts a solution containing the aqueous solution of inorganic fluoride salt".

In the present invention, the reason why the above-described ion concentration measuring device is required will be described below.

In the apparatus for preparing crystals of a phosphor precursor, in which the above-described ion concentration measuring device is provided inside the reactor, when the solution containing the aqueous solution of inorganic fluoride salt is added to the reactant mother liquor, the concentration of ion type consumed by the reaction can be measured. Namely, an amount of an aqueous solution of inorganic fluoride salt to be supplied again, and the like can be measured in a real time. Accordingly, due to a value obtained being fed back to the adding device by computation processing or the like, an amount of the solution containing the aqueous solution of inorganic fluoride salt supplied, a speed at which the solution is supplied, and the like can be controlled. Further, the solution is allowed to react while giving concentration gradient for a specified ion type, and therefore, controllability of grain shape, grain size, and grain size distribution of grains of crystals of a stimulable phosphor precursor to be obtained is improved. As a result, the crystals of a phosphor precursor, by which an image of high quality can be obtained when they are used in a radiation image conversion panel, can be prepared.

Further, the apparatus for preparing crystals of a phosphor precursor, in which the ion concentration measuring device is provided in the solution-contacting portion which contacts the solution containing an aqueous solution of inorganic fluoride salt will be hereinafter described.

First, in a case in which the ion concentration measuring device is provided in a middle position of the supply pipe, the ion concentration of the solution passing through the supply pipe can be measured in a real time. Accordingly, due to a value to be obtained being fed back to the adding device by computation processing or the like, the amount of the solution containing an aqueous solution of inorganic fluoride salt and the speed at which the solution is supplied can be controlled in such a manner as described above.

Further, in a case in which the apparatus for preparing crystals of a phosphor precursor of the present invention includes an instant reactor, which will be described later, and the ion concentration measuring device is provided in a middle position of the supply pipe at a downstream side of the instant reactor, the ion concentration of the solution delivered from the instant reactor can be measured in a real time. Accordingly, due to a value to be obtained being fed back to the adding device by computation processing, the amount of the solution containing an aqueous solution of inorganic fluoride salt and the speed at which the solution is supplied can be controlled in such a manner as described above.

The above-described ion concentration measuring device is not particularly limited. Generally, a sensor which is sensitive to a specified ion existing in the solution and indicates a voltage (or a potential) corresponding to a concentration or energy of the ion, and the like are used.

An ion to be detectable is not particularly limited. It is preferable that at least one of halogen ion, alkali metal ion, alkaline earth metal ion, rare earth element ion, ammonium ion, nitrate ion, and hydrogen ion be detectable.

Accordingly, suitable examples of the ion concentration detector used for the ion concentration measuring device include a barium ion detector, a fluorine ion detector, a bromine ion detector, iodine ion detector, an ammonium ion detector, and the like.

In a case in which the apparatus for preparing crystals of a phosphor precursor of the present invention is provided with an instant reactor, which will be described later, the ion concentration measuring device is preferably provided in the middle position of the supply pipe at a downstream side of the instant reactor.

[Other Members]

The other members are comprised of the instant reactor, the adding device, motors for driving the adding device, the stirrer, and the like, an arithmetic and control section in which computation processing of a value obtained by the ion concentration measuring device is effected, a motor driver, and the like.

The instant reactor is a device in which two or more types of solutions are mixed quickly and homogeneously. In the present invention, a reactant liquid such as the solution containing an aqueous solution of inorganic fluoride salt is mixed immediately before added to the reactant mother liquor, and crystal nuclei are formed. Accordingly, the instant reactor is preferably provided between the adding device for adding the aqueous solution of inorganic fluoride salt, and the reactor.

The instant reactor is preferably provided in such a manner as to mix solutions homogeneously and more quickly than a general reaction rate of substances contained in the solutions. For example, there is suitably used a device in which homogeneous crystal nuclei of ultra-fine grains are formed due to instantaneous mixing and reaction by a pair of stirring means rotating at a high speed and disposed in upper and lower portions of a cell having a limited capacity. A suspension liquid containing the formed crystal nuclei is successively discharged from a reaction cell by further adding the solution containing an aqueous solution of inorganic fluoride salt, and is introduced into the reactant mother liquor in a state of being stirred.

By using the instant reactor, crystals of a phosphor precursor of which grain size, grain aspect ratio, grain size, and grain size distribution are controlled more precisely can be obtained.

The above-described adding device is not particularly limited and generally known metering pumps can suitably be used. Examples of the known metering pump include a precision cylinder pump, a precision gear pump, a tube pump, a diaphragm pump, and the like. Among these pumps, the precision cylinder pump is preferable. The precision cylinder pump is preferably used for the reason that it is designed so as to precisely control an amount of each reactant liquid added, or a rate at which each reactant liquid is added.

The adding device accommodates a solution containing at least an aqueous solution of inorganic fluoride salt, and the solution is introduced into the reactor via the supply pipe. The number of the adding device and the type of liquids accommodated in the adding device, other than the solution containing an aqueous solution of inorganic fluoride salt, are not particularly limited, and can appropriately be selected in accordance with purposes. For example, an aqueous solution of $BaX_2$ or an aqueous solution of halide ammonium as a carrier liquid can suitably be used.

Further, the solution containing an aqueous solution of inorganic fluoride salt and an aqueous solution of $BaX_2$ may appropriately be referred to as a "reactant liquids" on occasion.

The motor for driving the stirrer or the like is not particularly limited, but a motor which allows rotation of the stirrer at a high speed is preferable.

FIG. 1 is a schematic structural diagram of an apparatus for preparing crystals of a phosphor precursor according to the present invention. An apparatus 1 for preparing crystals of a phosphor precursor includes a motor driver 2, an arithmetic/control section 3, an ion concentration meter 4, an ion concentration detector 5, a stirring motor 6, precision cylinder pumps 7, 7', pump motors 8, 8', a reactor 9, a stirrer 12, supply pipes 13, 13', and a mixing chamber 16.

A reactant mother liquor 10 is in advance prepared and accommodated in the reactor 9. Reactant liquids 11 and 11' are respectively accommodated in accommodating tanks (not shown) connected to the precision cylinder pumps 7 and 7'. When the reactant liquids 11 and 11' are supplied by the precision cylinder pumps 7 and 7' into the reactant mother liquor 10 via supply pipes 13 and 13', the ion concentration meter 4 connected to the ion concentration detector 5 measures the concentration of an ion type consumed by the reaction. The arithmetic/control section 3 connected to the ion concentration meter 4 effects computation processing for a measured value and transfers the obtained information to the motor driver 2. The motor driver 2 controls, based on the transferred information, the pump motors 8 and 8' for driving the precision cylinder pumps 7 and 7', and therefore, the amounts of the reactant liquids 11 and 11' supplied into the reactant mother liquor 10 via the supply pipes 13 and 13' from the precision cylinder pumps 7 and 7' and the rates at which the reactant liquids are supplied are controlled.

FIG. 2 is a schematic structural diagram of a series of equipment 14 which can be mounted in the apparatus 1 for preparing crystals of a phosphor precursor shown in FIG. 1 when the instant reactor is built in the apparatus 1 for preparing crystals of a phosphor precursor. In this figure, the reactor and its peripheries are not illustrated. The equipment 14 includes the motor driver 2, the arithmetic/control section 3, the ion concentration meter 4, the ion concentration detector 5, the precision cylinder pumps 7 and 7', the pump motors 8 and 8', the supply pipes 13, 13', and 13''', and the instant reactor 15. The same members as those shown in FIG. 1 will be denoted by the same reference numerals.

The instant reactor 15 accommodates therein a portion of each of the liquids delivered from the precision cylinder pumps 7 and 7' and stirs at a high speed, and thereafter, delivers the liquids outside. The instant reactor 15 includes a stirrer (not shown). The liquid discharged from the instant reactor 15 is introduced into a reactor (not shown).

An ion concentration detector 5' measures an ion concentration of a liquid immediately before the liquid discharged from the instant reactor 15 is introduced into a reactor (not shown).

[Process for Preparing Crystals of a Phosphor Precursor]

The above-described crystals of a phosphor precursor are suitably prepared by, for example, a process for preparing crystals of a phosphor precursor, comprising a mother liquor preparing step, a precipitate forming step, and a separating step, and further, comprises other steps when necessary, using the apparatus for preparing crystals of a phosphor precursor of the present invention. Further, by providing a firing step for firing the separated precipitate of crystals of a phosphor precursor while avoiding sintering thereof, a rare earth element-activated, alkaline earth metal fluorohalide based stimulable phosphor can be obtained.

For example, the crystal of a phosphor precursor which is represented by the above-described basic constitutional formula (1) is suitably prepared, using the apparatus for preparing crystals of a phosphor precursor of the present invention, by two types of processes (A) and (B) given below.

(A) This is a process for preparing crystals of a phosphor precursor, comprising:

a mother liquor preparing step for preparing a reactant mother liquor which is an aqueous solution containing $BaX_2$, a water soluble compound of Ln, a halide, nitrate, nitrite, or acetate of $M^{II}$ in addition if x in the basic constitutional formula (I) is not 0, and a halide, nitrate, nitrite, or acetate of $M^{I}$ in addition if y in the basic constitutional formula (I) is not 0, wherein the solution has a $BaX_2$ concentration of 2.5 mol/L or less if X is Cl or Br, or alternatively, a $BaX_2$ concentration of 5.0 mol/L or less if X is I after the foregoing components are dissolved, and for keeping the reactant mother liquor at 20 to 100° C. while being stirred;

a precipitate forming step for preparing a precipitate of crystals of a phosphor precursor by adding an aqueous solution of an inorganic fluoride salt and an aqueous solution of $BaX_2$ simultaneously to the reactant mother liquor kept at 20 to 100° C. while measuring an ion concentration in the reactant mother liquor by the ion concentration measuring device; and a separating step for separating the precipitate of crystals of a phosphor precursor from the aqueous solution.

(B) This is a process for preparing crystals of a phosphor precursor, comprising:

a mother liquor preparing step for preparing a reactant mother liquor which is an aqueous solution containing $NH_4X$, a water soluble compound of Ln, a halide, nitrate, nitrite, or acetate of $M^{II}$ in addition if x in the basic constitutional formula (I) is not 0, and a halide, nitrate, nitrite, or acetate of $M^I$ in addition if y in the basic constitutional formula (I) is not 0, wherein the solution has a $NH_4X$ concentration in a range from 2.0 mol/L to 4.5 mol/L after the foregoing components are dissolved, and for keeping the reactant mother liquor at 20 to 100° C. while being stirred;

a precipitate forming step for preparing a precipitate of crystals of a phosphor precursor by adding an aqueous solution of inorganic fluoride salt and an aqueous solution of $BaX_2$ simultaneously to the reactant mother liquor kept at 20 to 100° C. while measuring an ion concentration in the reactant mother liquor by the ion concentration measuring device; and a separating step for separating the precipitate of crystals of a phosphor precursor from the aqueous solution.

In the above-described precipitate forming step, the addition of the reactant liquid is controlled such that the ion concentration in the reactor becomes fixed or such that the ion concentration has a fixed gradient.

Next, the preparation processes (A) and (B) will be further described in detail.

Preparation Process (A):

(i) Mother Liquor Preparing Step

In the mother liquor preparing step, material compounds other than a fluorine-containing compound are dissolved using a water based medium, and a reactant mother liquor is prepared suitably in the reactor. Namely, $BaX_2$, a water soluble compound of Ln, and if necessary, a halide, nitrate, nitrite, or acetate of $M^{II}$, and further, if necessary, a halide, nitrate, nitrite, or acetate of $M^{II}$ are sufficiently mixed with the water based medium in the reactor, and dissolved. In this way, an aqueous solution (reactant mother liquor) in which these components are dissolved is prepared.

In this case, the proportion between the amounts of $BaX_2$ and the water based medium is adjusted such that the solution has a $BaX_2$ concentration of 2.5 mol/L or less if X is Cl or Br, or alternatively, a $BaX_2$ concentration of 5.0 mol/L or less if X is I. Examples of the water soluble compound of Ln include halides (chlorides, bromides, and the like), nitrates, and acetates, and the like of the above-mentioned rare earth elements. If desired, the reactant mother liquor may contain another materials, for example, a very small amount (1000 ppm or less) of a metal element, a non-metal element, or an amphoteric element, or alternatively, a small amount of an acid, ammonia, a water soluble polymer, or fine powder of a water insoluble metal oxide. The reactant mother liquor thus obtained is kept at 20 to 100° C., preferably at 40 to 80° C., and suitably stirred by the stirrer.

(ii) Precipitate Forming Step

In the precipitate forming step, by using the apparatus for preparing crystals of a phosphor precursor of the present invention, the reactant liquid, and if necessary, an aqueous solution of ammonium halide as a carrier liquid are simultaneously introduced into the reactor by the adding device via the supply pipe while measuring an ion concentration by the ion concentration measuring device, and mixed with the reactant mother liquor, to thereby obtain a precipitate of crystals of a phosphor precursor.

The concentration of ion type consumed by reaction during the above-mentioned introduction is measured by the ion concentration measuring device, and an obtained measurement value is subjected to computation processing, and thereafter, fed back to the adding machine or the like. The amount of the reactant liquid added and the adding rate of the liquid are controlled such that the ion concentration in the reactor becomes fixed or such that the ion concentration has a fixed gradient.

The inorganic fluoride salt is not particularly limited, and examples thereof may include ammonium fluoride, fluorides of alkaline metals, fluorides of alkaline earth metals, fluorides of transition metals, and hydrofluoric acid. Among these substances, ammonium fluoride and fluorides of alkali metals are preferable from the standpoints of solubility, light emission characteristics, and variation in pH during reaction.

The above-mentioned mixing is preferably effected in a state in which the reactant mother liquor is kept at 20 to 100° C.

(iii) Separating Step

In the separating step, the obtained precipitate of crystals of a phosphor precursor is separated from the aqueous solution by separating means, for example, suction filtration, pressurized filtration, or centrifugal separation. The precipitate of crystals of a phosphor precursor thus separated is sufficiently washed with a lower alcohol such as methanol, and then dried.

As described above, by using the apparatus for preparing crystals of a phosphor precursor of the present invention, in the precipitate forming step, the amount of reactant liquid added, and the adding rate of the liquid are adjusted such that the ion concentration in the reactor becomes fixed or such that the ion concentration has a fixed gradient. Accordingly, crystals of a phosphor precursor, in which controllability of grain shape, grain size, and grain size distribution of grains of the crystals is high, can be obtained.

A rare earth element-activated, alkaline earth metal fluorohalide based stimulable phosphor can be obtained by firing the obtained crystals of a phosphor precursor, which are represented by the basic constitutional formula (I) while avoiding sintering thereof. In order to avoid the above-mentioned sintering, there may be used, for example, a method in which a sintering preventing agent comprised of fine powder of silica, or metal oxide such as alumina, silica, zirconia, titania, or magnesia is added to and mixed with the crystals of the phosphor precursor and the fine powder of the sintering preventing agent is uniformly applied onto the surfaces of the crystals, and thereafter, the crystals are fired. It is also possible to omit the addition of the sintering preventing agent by properly adjusting the firing conditions.

Examples of the specific firing method may include a method in which crystals of a phosphor precursor, which has fine powder of the sintering preventing agent applied to the surface thereof if necessary, are packed into a heat-resistant container such as a quartz boat, an alumina boat, a quartz crucible, or an alumina crucible, and placed in a core of an electric furnace or the like. The firing temperature is preferably in the range from 400 to 1300° C., more preferably in the range from 500 to 1000° C. Although the firing time varies depending on the amount of crystals of a phosphor precursor packed, a firing temperature, temperatures at which the fired crystals are taken out from the furnace, and the like, it is generally in the range from 0.5 to 12 hours.

Examples of the firing atmosphere employed include a neutral atmosphere such as a nitrogen gas atmosphere, an argon gas atmosphere, or the like, a weakly reducing atmosphere such as a nitrogen gas atmosphere containing a very small amount of hydrogen gas, a carbon dioxide atmosphere containing carbon monoxide, and the like, and an atmosphere into which a very small amount of oxygen is introduced.

After the above-described firing, a target rare earth element-activated, alkaline earth metal fluorohalide based stimulable phosphor can be obtained.

Preparation Process (B):

(i) Mother Liquor Preparing Step

In the mother liquor preparing step, material compounds other than a fluorine-containing compound are dissolved using a water based medium, and a reactant mother liquor is prepared suitably in the reactor. Namely, $NH_4X$, a water soluble compound of Ln, and if necessary, a halide, nitrate, nitrite, or acetate of $M^{II}$, and further, if necessary, a halide, nitrate, nitrite, or acetate of $M^I$ are sufficiently mixed with the water based medium in the reactor, and dissolved. In this way, an aqueous solution (reactant mother liquor) in which these components are dissolved is prepared.

In this case, the proportion between the amounts of $NH_4X$ and the water based medium is adjusted such that the solution has an $NH_4X$ concentration in the range from 2.0 mol/L to 4.5 mol/L, preferably in the range from 3.0 mol/L to 4.5 mol/L. Examples of the water soluble compound of Ln include halides (chlorides, bromides, and the like), nitrates, and acetates, and the like of the above-mentioned rare earth elements. If desired, the reactant mother liquor may contain a small amount of an acid, ammonia, a water soluble polymer, or fine powder of a water insoluble metal oxide. The reactant mother liquor thus obtained is kept at 20 to 100° C., preferably at 40 to 80° C., and suitably stirred by the stirrer.

(ii) Precipitate Forming Step

In the precipitate forming step, by using the apparatus for preparing crystals of a phosphor precursor of the present invention, an aqueous solution of inorganic fluoride salt and an aqueous solution of $BaX_2$, and if necessary, an aqueous solution of ammonium halide as a carrier liquid are simultaneously introduced into the reactor by the adding device via the supply pipe while measuring an ion concentration by the ion concentration measuring device, and added to the reactant mother liquor, to thereby obtain a precipitate of crystals of a phosphor precursor.

The amount of the reactant liquid added and the adding rate of the liquid are suitably controlled in such a manner as in the above-described preparation process (A). Examples of the inorganic fluoride salt may include the same substances as those given in the preparation process (A). The above-described mixing is preferably effected in a state in which the reactant mother liquor is kept at a temperature of 20 to 100° C.

(iii) Separating Step

In the separating step, the precipitate of crystals of a phosphor precursor thus obtained is separated from the aqueous solution, and target crystals of a rare earth element-activated, alkaline earth metal fluorohalide based stimulable phosphor precursor can be obtained.

As described above, by using the apparatus for preparing crystals of a phosphor precursor of the present invention, in the precipitate forming step, the amount of reactant liquid added, and the adding rate of the liquid can be adjusted such that the ion concentration in the reactor becomes fixed or such that the ion concentration has a fixed gradient. Accordingly, crystals of a phosphor precursor, in which controllability of grain shape, grain size, and grain size distribution of grains of the crystals is high, can be obtained at a high yield.

The precipitate of crystals of a phosphor precursor thus obtained is further passed to a firing step for firing the precipitate without avoiding sintering thereof, and a rare earth element-activated, alkaline earth metal fluorohalide based stimulable phosphor is obtained. The details of the separating step and the firing and separating step are the same as those of the preparation process (A).

[Method for Manufacturing a Radiation Image Conversion Panel]

Next, a description will be given of a method for manufacturing a radiation image conversion panel using crystals of a phosphor precursor obtained by using the apparatus for preparing crystals of a phosphor precursor of the present invention.

The crystals of a phosphor precursor obtained by using the apparatus for preparing crystals of a phosphor precursor of the present invention form, after the above-described firing step, a rare earth element-activated, alkaline earth metal fluorohalide based stimulable phosphor (hereinafter referred to simply as "stimulable phosphor" on occasion). The stimulable phosphor is contained in a stimulable phosphor layer of the radiation image conversion panel.

Normally, the stimulable phosphor layer is comprised of a stimulable phosphor and a binder which contains and supports the stimulable phosphor in a dispersed state. The stimulable phosphor layer may further contain other stimulable phosphors and/or an additive such as a coloring agent.

The method for manufacturing a radiation image conversion panel is described in a case in which the stimulable phosphor layer is comprised of a stimulable phosphor and a binder which contains and supports the phosphor in a dispersed state.

The stimulable phosphor layer can be formed on a support by a generally known method, which will be described below. First, a stimulable phosphor and a binder are added into a solvent, and these substances are sufficiently mixed to thereby prepare a coating liquid having the stimulable phosphor uniformly dispersed in the binder solution. The mixing ratio between the binder and the stimulable phosphor in the coating liquid varies depending on the characteristics of a radiation image conversion panel to be obtained, the type of stimulable phosphor, and the like. However, the mixing ratio (weight ratio) of the binder to the stimulable phosphor is generally selected in the range from 1:1 to 1:100 and preferably in the range from 1:8 to 1:40. Next, the coating liquid thus obtained and containing the stimulable phosphor and the binder is uniformly applied onto the surface of a support, and a coating film is formed thereon. The coating operation can be performed by using ordinary coating means such as a doctor blade, a roll coater, a knife coater, and the like.

The support can be arbitrarily selected from ones which are conventionally known as materials of a support of the radiation image conversion panel. In a generally known radiation image conversion panel, in order to strengthen bonding of the support and the phosphor layer or to improve sensitivity or image quality (sharpness and graininess) of the radiation image conversion panel, the support includes, on the surface thereof at a side where the phosphor layer is provided, an adhesion promoting layer formed by applying a polymer such as gelatin thereto, a light reflection layer comprised of light reflecting substances such as titanium dioxide, a light absorbing layer comprised of light absorbing substances such as carbon black, and the like. The support used in the present invention can also include various layers as described above. The configuration of these layers can be arbitrarily selected in accordance with the purpose and application of a desired radiation image conversion panel. Further, as disclosed in JP-A No. 58-200200, the support may be formed in such a manner that micro unevenness is made on the surface thereof at a side which faces the phosphor layer (in a case in which the adhesion promoting layer, light reflective layer, or light absorbing layer is provided on the surface of the support at the side which faces the phosphor layer, which surface means the surface of any of these three layers), so as to improve the sharpness of an image to be obtained.

A coating film is formed on the support as described above, and thereafter dried so as to form a stimulable phosphor layer on the support. The thickness of the phosphor layer varies due to characteristics of the radiation image conversion panel to be obtained, the kind of a stimulable phosphor, the mixing ratio of the binder and the stimulable phosphor, and the like. Normally, the thickness of the layer is in a range from 20 $\mu$m to 1 mm, and preferably in a range from 50 to 500 $\mu$m. The stimulable phosphor layer needs not necessarily be formed by directly applying a coating liquid onto the support in such a manner as described above. For example, a phosphor layer may be formed on a separate sheet, such as a glass plate, a metal plate, or a plastic sheet by coating the coating liquid and further drying the coated layer. Subsequently, the phosphor layer thus obtained may be joined with the support by, for example, pressure or the use of an adhesive agent, and the separate sheet is peeled off.

As described above, usually, a protective film is provided on the stimulable phosphor layer. The protective film is formed by applying, onto the stimulable phosphor layer, a solution prepared by dissolving transparent organic high molecular substances such as cellulose derivatives or polymethyl methacrylate in a suitable solvent, or by providing, on the surface of a stimulable phosphor layer, an organic high polymeric film such as polyethylene terephthalate or a protective film-forming sheet such as a transparent glass plate by means of a suitable additive agent. Alternatively, the protective film is formed by providing a film on the stimulable phosphor layer by deposition of an inorganic compound. Further, a protective film may also be formed by applying (coating) a film comprised of a fluorine based resin soluble in an organic solvent, in which perfluoroolefin resin powder or silicone resin powder are dispersed and contained.

In order to improve the sharpness of an image to be obtained, at least one of the above-described various layers which form the radiation image conversion panel may be colored by a coloring agent which absorbs excitation light and does not absorb stimulable emitted light, and a colored intermediate layer may also be provided separately (see Japanese Patent Application Publication (JP-B) No. 54-23400).

According to the above-described processes, a radiation image conversion panel in which a stimulable phosphor layer is provided on a support can be manufactured by using crystals of a phosphor precursor obtained by the apparatus for preparing crystals of a rare earth element-activated, alkaline earth metal fluorohalide based stimulable phosphor precursor of the present invention.

EXAMPLES

The present invention will be described more specifically with reference to the following examples. In the examples and comparative examples, the term "aqueous solution" means an aqueous solution in general using water as the sole medium, regardless of how the term is used in the present invention.

Example 1

Using the apparatus for preparing crystals of a phosphor precursor shown in FIG. 1, crystals of a phosphor precursor (crystals of europium activated barium bromofluoride) are prepared in such a manner as described below.

Preparation of Respective Solutions:

A reactant mother liquor 10 (having a $BaBr_2$ concentration of 1.0 mol/L) comprised of 1200 mL of an aqueous solution of $BaBr_2$ (2.5 mol/L), 12.5 mL of an aqueous solution of $EuBr_3$ (0.2 mol/L), and 1787.5 mL of water was placed in a reactor 9 having a capacity of 4 liters. The reactant mother liquor 10 was kept at 60° C. and was stirred by using a screw-shaped stirrer 12 (a stirring blade), which has a diameter of 45 mm and of which periphery is enclosed in a mixing chamber 16 having a capacity of about 100 mL, rotating at 500 rpm so that an upward stream was generated from the mixing chamber 16. Further, an ion concentration detector 5 of Ba was inserted into the reactant mother liquid 10 from the liquid surface thereof and measurement of an ion concentration of Ba was started by the ion concentration detector 5 of Ba.

In order to obtain a solution containing an aqueous solution of inorganic fluoride salt, 50 mL of an aqueous solution of ammonium fluoride (10 mol/L) and 250 mL of water were mixed together to thereby prepare 300 mL of a solution containing an aqueous solution of ammonium fluoride.

An aqueous solution of $BaBr_2$ (2.5 mol/L) was separately prepared.

Addition of Solution Containing an Aqueous Solution of Inorganic Fluoride Salt:

The solution containing an aqueous solution of ammonium fluoride (that is, the solution containing an aqueous solution of inorganic fluoride salt) was accommodated in an accommodating tank (not shown) and added by using the precision cylinder pump 7 into the mixing chamber 16 in the reactant mother liquor 10 kept warm while being stirred at an adding rate of 5 ml/min. The precision cylinder pump 7 is not controlled by the ion concentration measuring device.

Addition of an Aqueous Solution of $BaBr_2$:

The above-described aqueous solution of $BaBr_2$ was accommodated in an accommodating tank (not shown) and added, by using the precision cylinder pump 7', into the mixing chamber 16 in the reactant mother liquor 10 kept warm while being stirred. The addition of the aqueous solution was performed in such a manner that consumption of Ba ion accompanied with proceeding of reaction, and a variation in the concentration of Ba ion caused by a change of the capacity of the reactant mother liquor 10 resulting from the addition of reactant liquid is measured by using the ion concentration measuring device of Ba and control is effected so that the concentration of Ba ion during the reaction becomes fixed.

A precipitate was thus formed. Even after completion of the addition, the reactant mother liquid was kept at the temperature and stirred for 2 hours so as to carry out the maturation of the precipitate. Subsequently, the precipitate was separated by filtration and washed with 2 L of methanol. The precipitate after being washed was collected and dried at 120° C. for 4 hours under a vacuum to thereby obtain about 110 g of crystals of a phosphor precursor (crystals of europium-activated, barium bromofluoride).

Comparative Example 1

About 110 g of crystals of a phosphor precursor (crystals of europium-activated, barium bromofluoride) was obtained by preparing respective solutions and adding the solution containing an aqueous solution of inorganic fluoride salt as in Example 1 except that the concentration of Ba ion was not measured by the ion concentration measuring device of Ba and no aqueous solution of $BaBr_2$ was added in preparation of the respective solutions of Example 1.

Example 2

Crystals of a phosphor precursor (crystals of europium-activated, barium bromofluoride) were prepared by using the apparatus for preparing crystals of a phosphor precursor shown in FIG. 1 in such a manner as described below.

In Example 2, although not illustrated in FIG. 1, an apparatus for preparing crystals of a phosphor precursor in which the same members as the precision cylinder pump 7, the pump motor 8, and the supply pipe 13, namely, a precision cylinder pump 7", a pump motor 8", and a supply pipe 13" are similarly provided, is used.

Preparation of Respective Solutions:

A reactant mother liquor 10 (having an $NH_4Br$ concentration of 3.5 mol/L) comprised of 1555.5 mL of an aqueous solution of $NH_4Br$ (4.5 mol/L), 12.5 ml of an aqueous solution of $EuBr_3$ (0.2 mol/L), and 432 mL of water was placed in a reactor 9 having a capacity of 4 liters. The reactant mother liquor 10 was kept at 60° C. and stirred by using a screw-shaped stirrer 12 (a stirring blade), which has a diameter of 45 mm and of which periphery was enclosed in a mixing chamber 16 having a capacity of about 100 mL, rotating at 500 rpm so that an upward stream was generated from the mixing chamber 16. Further, an ion concentration detector 5 of Br was inserted into the reactant mother liquor 10 from the liquid surface thereof and the measurement of ion concentration of Br was started by using the ion concentration detector 5 of Br.

In order to obtain absolution containing an aqueous solution of inorganic fluoride salt, 50 mL of an aqueous solution of ammonium fluoride (10 mol/L) and 50 mL of water was mixed to thereby prepare 100 mL of a solution containing an aqueous solution of ammonium fluoride.

Separately therefrom, 200 mL of an aqueous solution of $BaBr_2$ (2.5 mol/L) and an aqueous solution of $NH_4Br$ (4.5 mol/L) were respectively prepared.

Addition of an Aqueous Solution of $BaBr_2$ and an Aqueous Solution of Ammonium Fluoride:

The solution containing an aqueous solution of ammonium fluoride (that is, the solution containing an aqueous solution of inorganic fluoride salt) and the aqueous solution of $BaBr_2$ were each accommodated in a separate accommodating tank (not shown) and added by using the precision cylinder pumps 7 and 7' into the mixing chamber 16 in the reactant mother liquor 10 kept at the temperature while being stirred at adding rates of 2 ml/minute and of 4 ml/minute, respectively. The precision cylinder pumps 7 and 7' are not controlled by the ion concentration measuring device.

Addition of an Aqueous Solution of $NH_4Br$:

The above-described aqueous solution of $NH_4Br$ was accommodated in an accommodating tank (not shown) and added, by using the precision cylinder pump 7", into the mixing chamber 16 in the reactant mother liquor 10 kept at the temperature while being stirred. The addition of the aqueous solution was performed in such a manner that consumption of Br ion accompanied with proceeding of reaction, and a variation in the concentration of Br ion caused by a change of the capacity of the reactant mother liquor 10 resulting from the addition of reactant liquid is measured by using the ion concentration measuring device of Br, and control is effected so that the concentration of Br ion during the reaction becomes fixed.

A precipitate was thus formed. Even after completion of the addition, the reactant mother liquid was kept at the temperature and stirred for 2 hours so as to carry out the maturation of the precipitate. Subsequently, the precipitate was separated by filtration and washed with 2 L of methanol. The precipitate after being washed was collected and dried at 120° C. for 4 hours under a vacuum to thereby obtain about 110 g of crystals of a phosphor precursor (crystals of europium-activated, barium bromofluoride).

Comparative Example 2

About 110 g of crystals of a phosphor precursor (crystals of europium-activated, barium bromofluoride) was obtained by preparing the respective solutions and adding the solution containing the aqueous solution of inorganic fluoride salt as in Example 2 except that the concentration of Br ion was not measured by the ion concentration measuring device of Br and no aqueous solution of $NH_4Br$ was added.

Evaluation of Crystals of Phosphor Precursor

The grain size (median diameter), grain size distribution, grain shape, uniformity of grain shape, and grain aspect ratio were measured and evaluated for the obtained crystals of phosphor precursor in such a manner as described below. The results are shown in Table 1.

Measurement of Grain Size (Median Diameter, Dm):

The crystals obtained in the examples and comparative examples were subjected to the grain size (median diameter, Dm ($\mu$m)) measurement using a grain size distribution measuring apparatus based on light diffraction (model LA-500 manufactured by Horiba Seisakusho Co., Ltd.).

Measurement and Evaluation of Grain Size Distribution:

A standard deviation ($\sigma$) was calculated from a distribution chart obtained by using the grain size distribution measuring apparatus based on light diffraction, and a ratio between the standard deviation ($\sigma$) and median grain size (median diameter, Dm ($\mu$m)) was calculated and evaluated.

Evaluation of Grain Shape and Uniformity of Grain Shape:

The obtained crystals of phosphor precursor were observed and evaluated by using a scanning electron microscope (model JSM-5400LV manufactured by Nihon Denshi Ltd.). The evaluation of the uniformity of grain shape was made based on the following criterion.

⊚. . . Grain size was extremely uniform.
◯. . . Grain size was uniform to such an extent that no problem occurs in practical use.

Measurement and Evaluation of Grain Aspect Ratio:

The grain aspect ratio was calculated by actually measuring the length to width ratios of 200 grains of the crystals in the photographs obtained by the scanning electron microscope and averaging these values.

TABLE 1

| | Example 1 | Comparative example 1 | Example 2 | Comparative example 2 |
| --- | --- | --- | --- | --- |
| Grain size median diameter ($\mu$m) | 4.77 | 4.70 | 12.41 | 11.17 |

TABLE 1-continued

| | Example 1 | Comparative example 1 | Example 2 | Comparative example 2 |
|---|---|---|---|---|
| Standard deviation (σ) of grain distribution | 1.89 | 2.02 | 4.96 | 5.45 |
| σ/Dm (%) | 39.6 | 43.0 | 40.0 | 48.8 |
| Grain shape | Tetradeca-hedron | Tetradeca-hedron | Columnar | Columnar |
| Uniformity of grain shape | ⊚ | ○ | ⊚ | ○ |
| Grain aspect ratio | 1.02 | 1.06 | 3.51 | 3.22 |

It can be seen from the results of Table 1 that the crystals of phosphor precursor of Examples 1 and 2 prepared by using the apparatus for preparing crystals of rare earth element-activated, alkaline earth metal fluorohalide based stimulable phosphor precursor of the present invention have uniform grain size and grain shape and are excellent in controllability of grain size distribution as compared with the crystals of phosphor precursor of comparative examples 1 and 2.

In this way, the present invention can provide an apparatus for preparing crystals of a rare earth element-activated, alkaline earth metal fluorohalide based stimulable phosphor precursor, in which controllability of grain shape, grain size, and grain size distribution of grains of crystals of a stimulable phosphor precursor to be obtained is high and the crystals of phosphor precursor can be obtained at a high yield. Particularly, the apparatus for preparing crystals of a rare earth element-activated, alkaline earth metal fluorohalide based stimulable phosphor precursor, in which when the phosphor precursor crystals are used in a radiation image conversion panel, images of high quality can be obtained, and a stimulable phosphor having good sensitivity and graininess can be obtained, can be provided.

What is claimed is:

1. A process for preparing crystals of a rare earth element-activated, alkaline earth metal fluorohalide based stimulable phosphor precursor having a basic constitutional formula (1) as follows:

$$Ba_{1-x}M_x^{II}FX: yM^I, zLn \quad (1)$$

wherein, $M^{II}$ represents at least on alkaline earth metal selected from the group consisting of Sr and Ca: $M^I$ represents at least one alkaline metal selected from the group consisting of Li, Na, K, Rb, and Cs; X represents at least one halogen selected from the group consisting of Cl, Br, and I; Ln represents at least one rare earth element selected from the group consisting of Ce, Pr, Sm, Eu, Gd, Tb, T, and Yb; and x, y and z are respectively within the ranges of $0 \leq x \leq 0.5$, $0 \leq y \leq 0.5$, and $0 < z \leq 0.2$, the process comprising the steps of:

(a) preparing a reactant mother liquor of an aqueous solution containing $BaX_2$, a water soluble compound of Ln, a halide, a nitrate, nitrite, an acetate of $M^{II}$ if x in the basic constitutional formula (1) is not 0, and a halide, nitrate, nitrite, or acetate of $M^1$ if y in the basic constitutional formula (1) is not 0, wherein the solution has a $BaX_2$ concentration of no more than 2.5 mol/L if X is Cl or Br, and a $BaX_2$ concentration of up to 5.0 mol/L if X is I after all substances have been substantially dissolved in said aqueous solution;

(b) maintaining the reactant mother liquor at 20 to 100° C. while stirring;

(c) preparing a precipitate of crystals of the phosphor precursor by simultaneously adding an aqueous solution of an inorganic fluoride salt and an aqueous solution of $BaX_2$ to the reactant mother liquor, while maintaining the reactant mother liquor at 20 to 100° C., and measuring an ion concentration in the reactant mother liquor using an ion concentration measuring device such that the ion concentration in the reactant mother liquor is constant; and (d) separating the precipitate of crystals of the phosphor precursor.

2. A process for preparing crystals of a rare earth element-activated, alkaline earth metal fluorohalide based stimulable phosphor precursor having basis constitutional formula (1) as follows:

$$Ba_{1-x}M_x^{II}FX: yM^I, zLn \quad (1)$$

wherein $M^{II}$ represents at least on alkaline earth metal selected from the group consisting of Sr an Ca: $M^I$ represents at least one alkaline metal selected from the group consisting of Li, Na, K, Rb, and Cs; X represents at least one halogen selected from the group consisting of Cl, Br, and I; Ln represents at least one rare earth element selected from the group consisting of Ce, Pr, Sm, Eu, Gd, Tb, Tm, and Yb; and x, y and z are respectively within the ranges of $0 \leq x \leq 0.5$, $0 \leq y \leq 0.05$, and $0 < z \leq 0.2$, the process comprising the steps of:

(a) preparing a reactant mother liquor of an aqueous solution containing $NH_4X$, a water soluble compound of Ln, a halide, a nitrate, nitrite, an acetate of $M^{II}$ if x in the basis constitutional formula (1) is not 0, wherein the solution has a NH4X concentration from 2.0 to 4.5 mol/L after all substances have been substantially dissolved in said aqueous solution;

(b) maintaining the reactant mother liquor at 20 to 100° C. while stirring;

(c) preparing a precipitate of crystals of the phosphor precursor by adding an aqueous solution of inorganic fluoride salt and an aqueous solution of $BaX_2$ simultaneously to the reactant mother liquor, while maintaining the reactant mother liquor at 20 to 100° C., and measuring an ion concentration in the reactant mother liquor by using an ion concentration measuring device such that the ion concentration in the reactant mother liquor has a fixed gradient; and (d) separating the precipitate of crystals of the phosphor precursor.

3. The process according to claim 1, wherein the ion concentration measuring device detects at least one of a halogen ion, an alkali metal ion, an alkaline earth metal ion, a rare earth element ion, an ammonium ion, a nitrate ion and a hydrogen ion.

4. The process according to claim 2, wherein the ion concentration measuring device detects at least one of a halogen ion, an alkali metal ion, an alkaline earth metal ion, a rare earth element ion, an ammonium ion, a nitrate ion and a hydrogen ion.

5. The process according to claim 1, wherein the process is effected by apparatus comprising at least one selected from a group consisting of a reactor, a stirrer, a supply pipe, an ion concentration measuring device, an instant reactor, an adding device, a motor, an arithmetic/control section, a motor driver, and an accommodating tank.

6. The process according to claim 2, wherein the process is effected by apparatus comprising at least one selected from a group consisting of a reactor, a stirrer, a supply pipe, an ion concentration measuring device, an instant reactor, an adding device, a motor, an arithmetic/control section, a motor driver, and an accommodating tank.

7. The process according to any one of claim 5 or 6, wherein the ion concentration measuring device is connected to the arithmetic/control section.

8. The process according to any one of claim 5 or 6, wherein the step of preparing a precipitate comprises a sub-step wherein an amount of reactant liquid added to the reactor and an addition rate of the reactant liquid are controlled by the arithmetic/control section, based on an ion concentration which is measured by the ion concentration measuring device.

9. The process according to claim 8, wherein the sub-step is a step wherein the adding device adds the reactant liquid to the reactor via a supply pipe based on an arithmetical result of the arithmetic/control section, such that the ion concentration in the reactor is constant.

10. The process according to claim 8, wherein the sub-step is a step wherein the adding device adds the reactant liquid to the instant reactor via a supply pipe based on an arithmetical result of the arithmetical/control section, such that the ion concentration in the reactor has a fixed gradient.

* * * * *